United States Patent
Nguyen

(10) Patent No.: US 9,263,937 B2
(45) Date of Patent: Feb. 16, 2016

(54) SHORT PROTECTION CIRCUIT FOR POWER SWITCH AND ASSOCIATED PROTECTION METHOD

(71) Applicant: Monolithic Power Systems, Inc., San Jose, CA (US)

(72) Inventor: James H. Nguyen, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 306 days.

(21) Appl. No.: 14/103,778

(22) Filed: Dec. 11, 2013

(65) Prior Publication Data
US 2015/0162819 A1 Jun. 11, 2015

(51) Int. Cl.
*H02M 1/32* (2007.01)
*H03K 17/082* (2006.01)

(52) U.S. Cl.
CPC .............. *H02M 1/32* (2013.01); *H03K 17/0822* (2013.01); *H03K 2217/0027* (2013.01); *H03K 2217/0063* (2013.01); *H03K 2217/0072* (2013.01)

(58) Field of Classification Search
CPC ........................................................ H02M 1/32
USPC ...................... 363/50, 56.03, 56.11
See application file for complete search history.

(56) References Cited

U.S. PATENT DOCUMENTS

| | | | | |
|---|---|---|---|---|
| 4,394,750 A * | 7/1983 | Gercekci | ............... | G11C 16/22 365/185.04 |
| 5,212,616 A * | 5/1993 | Dhong | ................ | H01L 27/0921 257/E27.063 |
| 5,825,638 A * | 10/1998 | Shutts | ...................... | H02M 1/32 348/E5.127 |
| 6,304,462 B1 * | 10/2001 | Balakrishnan | .... | H02M 3/33507 363/21.01 |
| 7,133,300 B1 * | 11/2006 | Yang | ...................... | H02H 7/122 323/284 |
| 7,149,098 B1 * | 12/2006 | Chen | ...................... | H02M 1/32 323/285 |
| 8,283,808 B2 * | 10/2012 | Chojecki | ............ | H03K 17/0822 307/115 |
| 8,630,103 B2 * | 1/2014 | Baurle | .............. | H02M 3/33507 363/21.17 |
| 2002/0130645 A1 * | 9/2002 | Tsai | ............................ | G05F 1/24 323/274 |
| 2003/0206426 A1 * | 11/2003 | Lin | ..................... | H02M 7/53806 363/132 |
| 2005/0135036 A1 * | 6/2005 | Kanamori | ............. | H02M 3/156 361/93.1 |
| 2006/0227476 A1 * | 10/2006 | Yang | ................. | H02M 3/33507 361/90 |
| 2007/0217095 A1 * | 9/2007 | Choi | ................. | H02M 3/33507 361/18 |
| 2009/0097284 A1 * | 4/2009 | Takei | ................. | H02M 3/33507 363/56.1 |
| 2009/0257251 A1 * | 10/2009 | Su | ...................... | H02M 3/33523 363/21.15 |
| 2010/0149712 A1 * | 6/2010 | Wang | ................. | H02M 3/33515 361/93.2 |
| 2010/0165676 A1 * | 7/2010 | Fang | ..................... | H02H 7/1203 363/50 |
| 2011/0002068 A1 * | 1/2011 | Hu | .......................... | H02M 1/32 361/18 |
| 2011/0267853 A1 * | 11/2011 | Yang | ..................... | H02H 7/1213 363/56.01 |
| 2012/0049829 A1 * | 3/2012 | Murakami | .............. | H02M 1/32 323/288 |
| 2012/0106215 A1 * | 5/2012 | Chia | ........................ | H02M 1/32 363/124 |
| 2012/0147630 A1 * | 6/2012 | Cao | ........................ | H02H 3/006 363/21.15 |
| 2013/0083562 A1 * | 4/2013 | Wu | .......................... | H02M 1/32 363/16 |
| 2013/0135775 A1 * | 5/2013 | Yao | ......................... | H02H 9/025 361/18 |
| 2014/0071720 A1 * | 3/2014 | Ouyang | ............... | H02H 7/1213 363/50 |
| 2014/0160601 A1 * | 6/2014 | Ouyang | ................. | H02M 3/158 361/18 |

* cited by examiner

*Primary Examiner* — Timothy J Dole
*Assistant Examiner* — Yusef Ahmed
(74) *Attorney, Agent, or Firm* — Perkins Coie LLP

(57) ABSTRACT

A short protection circuit for protecting a power switch. The short protection circuit has a transistor and compares a differential voltage between a first end of the power switch and a second end of the power switch to a threshold voltage of the transistor only when the power switch is in an ON state; and wherein when the differential voltage is higher than the threshold voltage, the short protection circuit turns off the power switch.

16 Claims, 10 Drawing Sheets

SHORT PROTECTION CIRCUIT FOR POWER SWITCH AND ASSOCIATED PROTECTION METHOD

TECHNICAL FIELD

The present invention generally relates to electrical circuit, more particularly and not exclusively relates to short protection circuit for power switch and associated protection method.

BACKGROUND

Switch Mode Power Supply (SMPS) is widely used for converting an input voltage into an output voltage and supplying a load, due to its many advantages such as high efficiency, high current carrying ability and so on. The output voltage is usually regulated by controlling a duty cycle of a power switch where the duty cycle is the ratio of the on time in a cycle period. SMPS comprises many topologies such as boost converter, buck converter, flyback converter, etc.

FIG. 1 illustrates a prior art boost converter for converting an input voltage Vin at an input port IN into an output voltage Vout at an output port OUT, wherein the output voltage Vout is higher than the input voltage Vin. The output voltage Vout is regulated under the switching action of a power switch Q which is coupled between a switching node SW and a reference ground GND. Boost converter further comprises an inductor L1 coupled between input port IN and switching node SW, a rectifier D1 coupled between switching node SW and output port OUT, and an output capacitor Gout coupled between output port OUT and reference ground GND. However, when power switch Q is in ON state and if switching node SW is electrically shorted to input voltage Vin, current flowing through power switch Q would increase dramatically and power switch Q would be damaged. Thus, a short protection circuit is required to protect power switch Q from being damaged when switching node SW is shorted to a high voltage rail such as input port IN.

Conventional short protection circuit normally uses a current amplifier for sensing the current flowing through power switch Q and a current comparator for comparing the current signal with a maximum current reference. When the current signal rises above the maximum current reference, power switch Q is turned off. However, the current comparator is required to have high accuracy which would have a long response delay. Due to the delay of the current sense amplifier, the delay of the current comparator and the other delays, the current flowing through power switch Q at the time when power switch Q is turned off is much higher than the maximum current reference. And power switch Q would be damaged.

Accordingly, a short protection circuit is required to at least address one or some of the above deficiencies.

SUMMARY

In one embodiment, a short protection circuit for protecting a power switch is disclosed. The power switch has a first end, a second end and a control end and the short protection circuit has a first input, a second input and an output, wherein the first input of the short protection circuit is coupled to the first end of the power switch, the second input of the short protection circuit is coupled to the second end of the power switch, and the output of the short protection circuit is configured to provide a short protection signal. The short protection circuit comprises a transistor, and wherein the transistor has a threshold voltage; the short protection circuit is configured to compare a differential voltage between the first end of the power switch and the second end of the power switch, to the threshold voltage of the transistor only when the power switch is in an ON state; and wherein when the differential voltage is higher than the threshold voltage, the short protection signal transits in an effective state configured to turn off the power switch.

In another embodiment, a SMPS comprising: a switching circuit for converting an input voltage at an input port into an output voltage at an output port, wherein the switching circuit comprises a power switch and is configured to regulate the output voltage via controlling the ON and OFF actions of the power switch, and wherein the power switch has a first end, a second end and a control end; an on-control signal generator having an output configured to provide an on-control signal for selectively turning on the power switch; a short protection circuit configured to provide a short protection signal, the short protection circuit comprising a transistor, wherein the short protection circuit is configured to compare a differential voltage between the first end of the power switch and the second end of the power switch to a threshold voltage of the transistor to obtain a comparing signal only when the power switch is in an ON state, and wherein the short protection signal is generated according to the comparing signal; and a logic circuit having a first input, a second input and an output, wherein the first input of the logic circuit is configured to receive the on-control signal, the second input of the logic circuit is configured to receive the short protection signal, and the output of the logic circuit is coupled to a control end of the power switch for turning on and off the power switch.

In yet another embodiment, a short protection method for a power switch comprising: detecting a state of the power switch; comparing a differential voltage across the power switch to a threshold voltage of a transistor when the power switch is in an ON state; and turning off the power switch when the differential voltage is higher than the threshold voltage.

BRIEF DESCRIPTION OF THE DRAWINGS

Non-limiting and non-exhaustive embodiments are described with reference to the following drawings. The drawings are only for illustration purpose. Usually, the drawings only show part of the systems or the circuits of the embodiments.

The use of the same reference label in different drawings indicates the same or like components.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Embodiments according to the present invention selectively monitor a differential voltage of a power switch via a transistor, and compare the differential voltage to a threshold voltage of the transistor for short protection. Since the monitored differential voltage is either small, for example less than 100 mV during normal condition, or large for example equaling input voltage during short condition, a very fast non accurate comparator may be used to quickly shut off and protect the power switch. Accordingly, the time delay between short condition occurrence and turning off the power switch is very short. Short protection circuit via comparing the differential voltage to a threshold of a transistor may be used alone or in conjunction with conventional protection circuit having current comparator.

Figure 1:
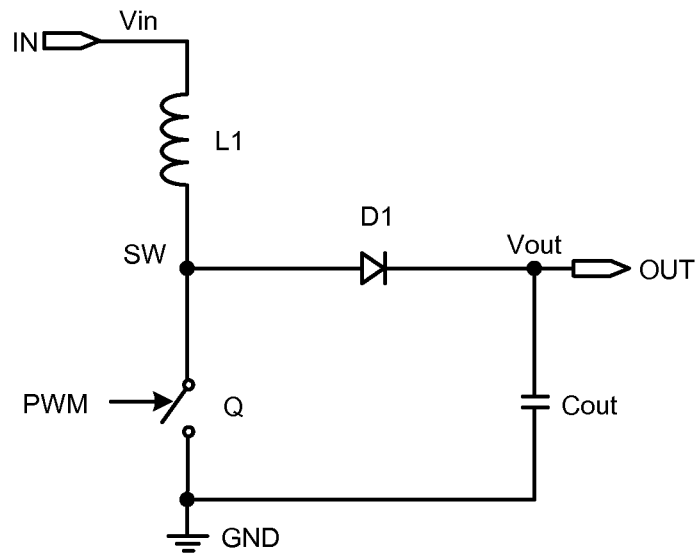
FIG. 1 shows a prior art boost converter.
Figure 2:
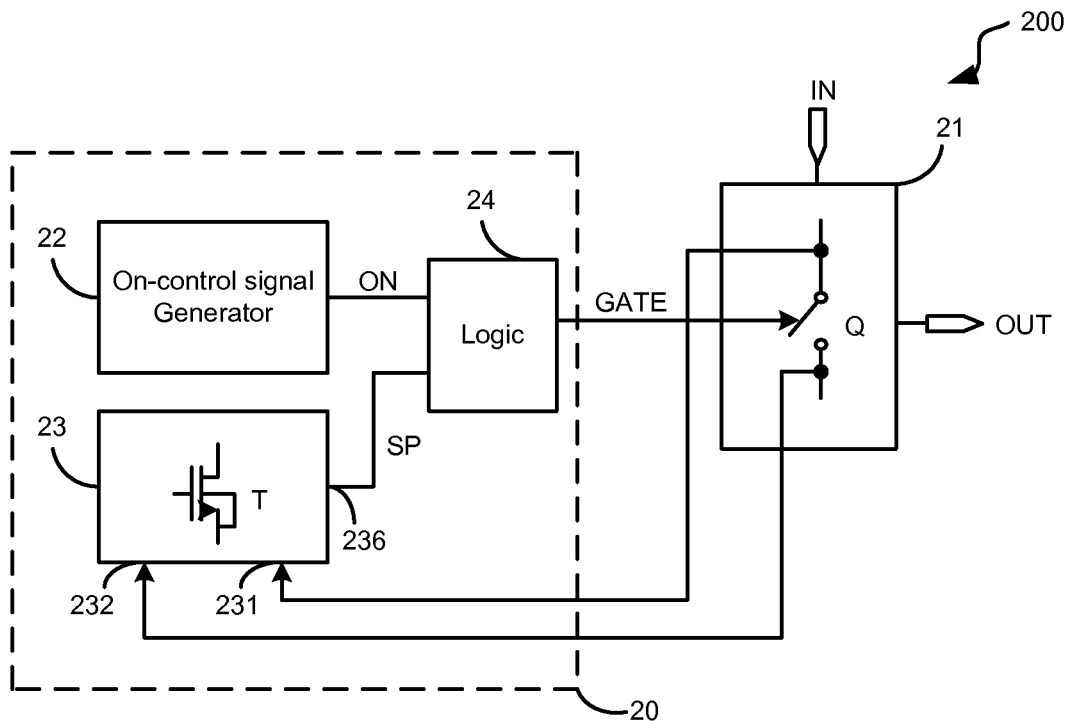
FIG. 2 illustrates a block diagram of a SMPS system 200 according to an embodiment of the present invention.

FIG. 2 illustrates a block diagram of a SMPS system 200 according to an embodiment of the present invention. SMPS system 200 comprises a switching circuit 21 for converting an input voltage at an input port IN into an output voltage at an output port OUT, and a controller 20 for regulating the output voltage. Switching circuit 21 comprises a power switch Q and regulates the output voltage at output port OUT via controlling the ON and OFF actions of power switch Q. Switching circuit 21 may comprise a boost converter as shown in FIG. 1, a buck converter or any other type of switch mode power supply converter. Yet in other embodiments, circuit 21 may be any form other than a SMPS, for example, a hot swap circuit or an electrical fuse circuit. Controller 20 outputs a gate control signal GATE coupled to a control end of power switch Q for controlling the ON and OFF actions of power switch Q. Controller 20 comprises an on-control signal generator 22, a short protection circuit 23 and a logic circuit 24.

The on-control signal generator 22 has an output configured to provide an on-control signal ON which selectively turns on power switch Q. During normal operation, power switch Q is turned on when on-control signal ON is in an effective state for example in logic HIGH. In one embodiment, on-control signal ON comprises a Pulse Width Modulation (PWM) signal. And under normal operation when short condition does not occur, on-control signal ON controls the ON and OFF actions of power switch Q and regulates the output voltage at output port OUT by adjusting the duty cycle of on-control signal ON. A short condition is when the power switch is in an ON state, power switch is abnormally coupled to a voltage rail such that the voltage across the power switch is abnormally high. In one embodiment, on-control signal generator 22 comprises a constant on-time controller.

Short protection circuit 23 has a first input 231, a second input 232 and an output 236, wherein the first input 231 is coupled to a first end of power switch Q, the second input 232 is coupled to a second input of power switch Q, and output 236 of short protection circuit 23 provides a short protection signal SP. Thus short protection circuit 23 may detect a differential voltage Vd across power switch Q between the first end of power switch Q and the second end of power switch Q. Short protection signal SP transits in an effective state to turn off power switch Q when short condition occurs. Short protection circuit 23 comprises a transistor T. When short protection circuit 23 detects that power switch Q is in the ON state which may be indicated by a gate control signal GATE, short protection circuit 23 is enabled and compares differential voltage Vd to a threshold voltage of transistor T, and turns off power switch Q when differential voltage Vd is higher than the threshold voltage of transistor T. When short protection circuit 23 detects that power switch Q is in OFF state, short protection circuit 23 is disabled and will not compare differential voltage Vd to the threshold of transistor T. In another embodiment, the ON state of power switch Q may be determined by on-control signal ON. And yet in another embodiment, the ON state of power switch Q is determined by on-control signal and short protection signal SP, and the ON state of power switch Q is indicated by that on-control signal ON is in effective state and the short protection signal SP is in ineffective state.

Logic circuit 24 has a first input configured to receive on-control signal ON, a second input configured to receive short protection signal SP, and an output coupled to the control end of power switch Q. In one embodiment, the output of logic circuit 24 is coupled to the control end of power switch Q indirectly through a driver circuit where the driver circuit is coupled between the logic circuit 24 and the control end of power switch Q to provide gate control signal GATE based on the output of logic circuit 24. And in another embodiment, logic circuit 24 directly provides gate control signal GATE.

Continuing with FIG. 2, when short protection signal SP is in effective state, for example in logic LOW, gate control signal GATE transits in an ineffective state to turn off power switch Q. When short protection signal SP is in an ineffective state, for example in logic HIGH, gate control signal GATE may be determined by on-control signal ON to turn on and off power switch Q. In one embodiment, logic circuit 24 comprises an AND gate. And in another embodiment, logic circuit 24 comprises a NAND gate which may also be deemed as comprising an AND gate and a NOT gate. And in some embodiments, the logic circuit further receives other signals such as over-temperature signal, under voltage protection signal and so on for controlling power switch Q.

In one embodiment, short protection circuit 23 is enabled with a blanking time after gate control signal GATE transits in effective state to ensure that the voltages across power switch Q is settled. And short protection signal SP can only be in effective state when short protection circuit 23 is enabled. Where the effective state of gate control signal is used to turn on power switch Q. And thus short protection signal SP turns off power switch Q only when power switch Q is in the ON state and the voltages across power switch Q are settled. Differential voltage Vd would be in a low voltage during the ON state of power switch Q during normal operation. However, when power switch Q is abnormally shorted to a voltage rail, differential voltage Vd across the power switch may be abnormally high and power switch Q would be damaged when without protection. When short protection circuit 23 is enabled and differential voltage Vd across power switch Q is higher than the threshold voltage of transistor T, transistor T transits into an effective state, for example in an ON state to trigger short protection signal SP into effective state, and power switch Q is then turned off. Since differential voltage Vd would be either very high during short condition or be very low during normal condition, the accuracy requirement for short protection circuit 23 is very low, and the time delay between the occurrence of abnormal shortage and the effective state shift of short protection signal SP may be very little, and accordingly power switch Q may be protected from electrical short damage in short time.

Figure 3:
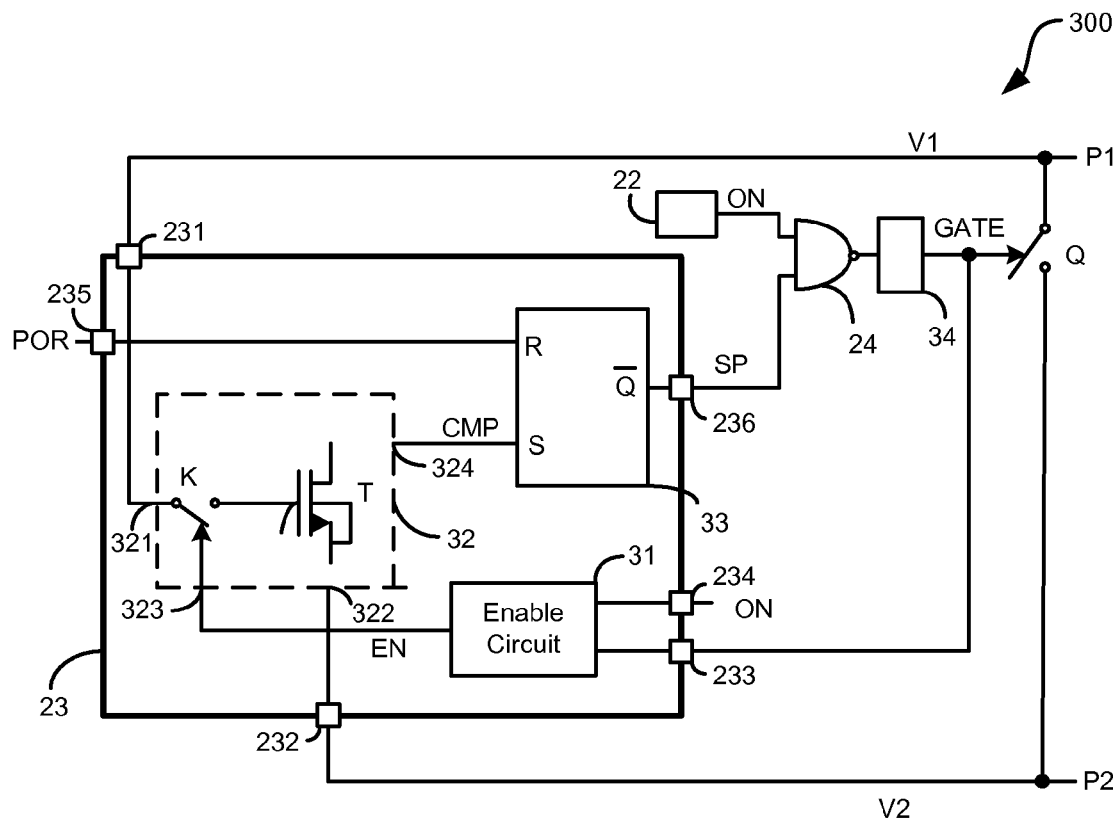
FIG. 3 illustrates a power switch control circuit 300 according to an embodiment of the present invention.

FIG. 3 illustrates a power switch control circuit 300 comprising a short protection circuit 23 according to an embodiment of the present invention. Power switch control circuit 300 comprises a power switch Q, an on-control signal generator 22, a short protection circuit 23, a logic circuit 24 and a driver circuit 34. Power switch Q has a first end, a second end and a control end, wherein the first end of power switch Q is coupled to a first power node P1 and the second end of power switch Q is coupled to a second power node P2. The labels P1 and P2 may also refer to the first end of power switch Q and the second end of power switch Q respectively.

In one embodiment, power switch Q is used as a low-side switch in a boost converter, the first power node P1 comprises a switching node SW, and the second power node P2 comprises a reference ground node GND, with reference to FIG. 1.

Figure 8:
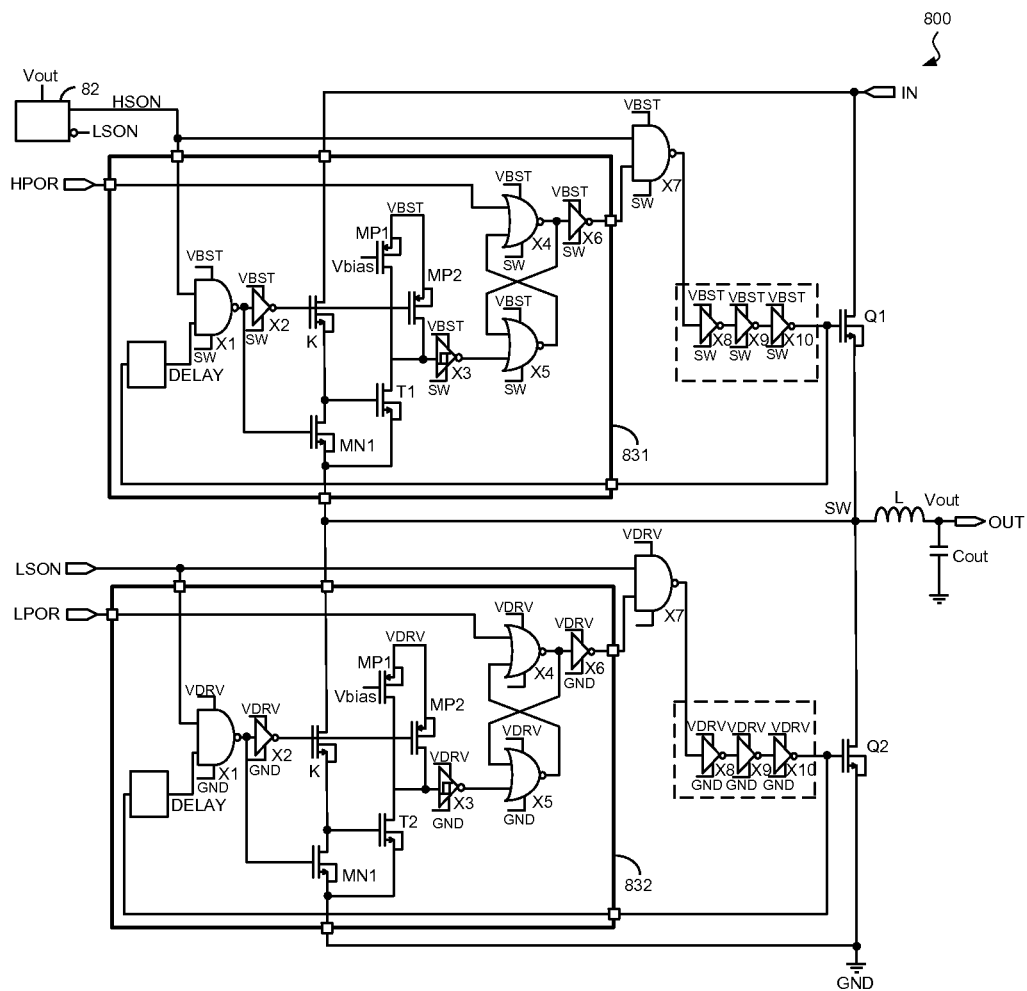
FIG. 8 illustrates a buck converter 800 according to an embodiment of the present invention.

In another embodiment, power switch Q is used as a high-side power switch of a buck converter, with reference to power switch Q1 as shown in FIG. 8, and accordingly the first power node P1 comprises an input port IN and the second power node P2 comprises a switching node SW.

In yet another embodiment, power switch Q is used as a low-side power switch or synchronous rectifier of a buck converter, with reference to power switch Q2 as shown in FIG. 8, and accordingly the first power node P1 comprises the switching node SW and the second power node P2 comprises the reference ground node GND.

Figure 9:
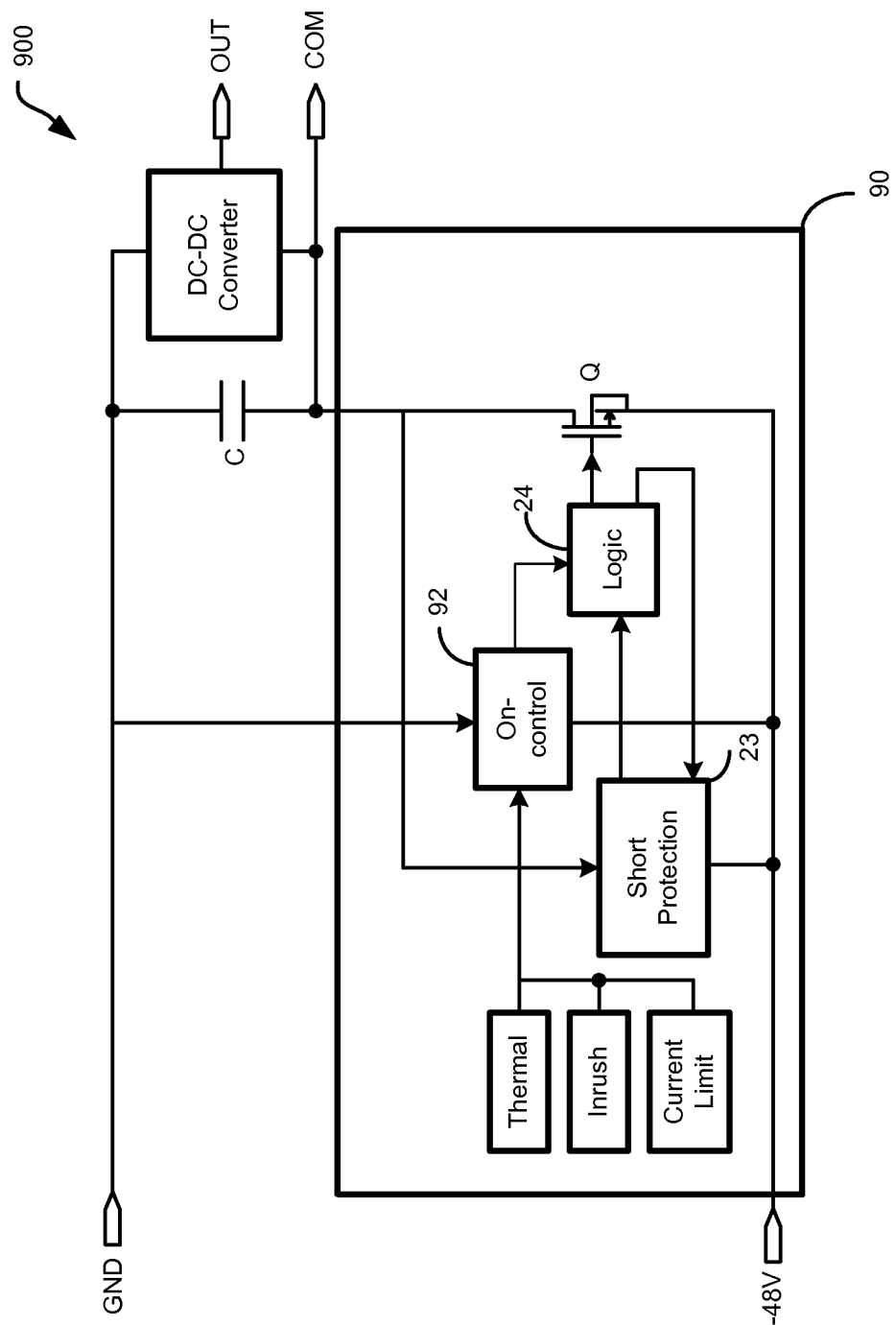
FIG. 9 illustrates a hot-swap circuit 900 comprising a load switch Q, according to an embodiment of the present invention.
Figure 10:
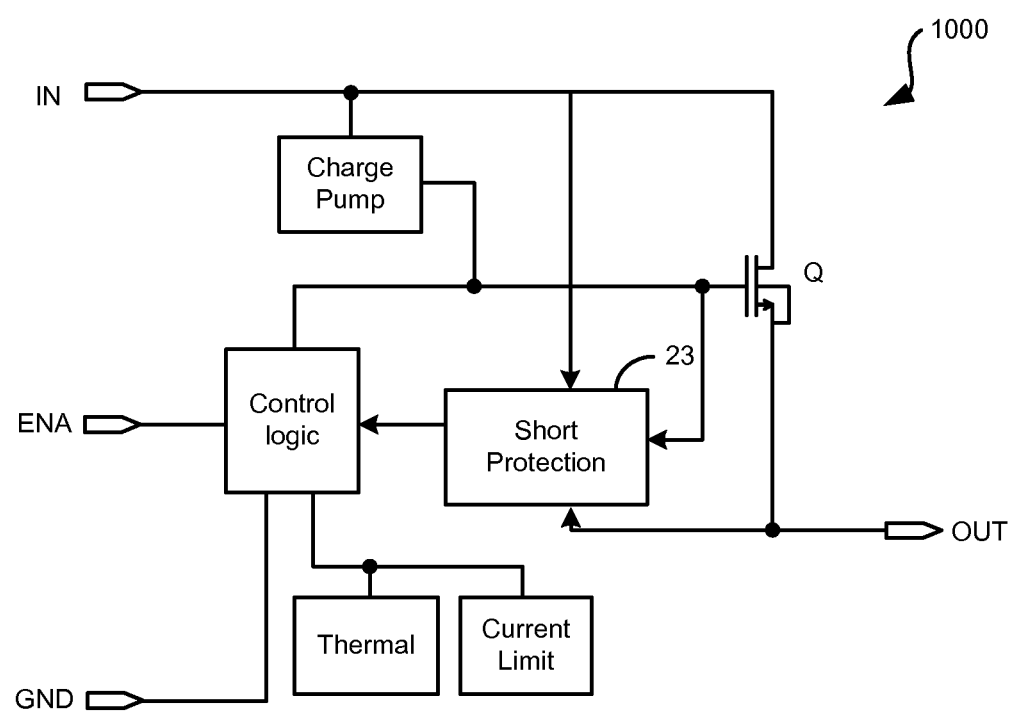
FIG. 10 illustrates an electrical fuse circuit 1000 comprising an electrical fuse power switch Q according to an embodiment of the present invention.

In yet other embodiments, power switch Q may be used in any other possible topologies, for example, used as a load switch Q in a hot swap circuit as shown in FIG. 9, or an electrical fuse power switch Q as shown in FIG. 10.

On-control signal generator 22 has an output configured to provide an on-control signal ON for selectively turning on power switch Q. On-control signal generator 22 may be in any possible form that can generate such signal for turning on a power switch. In one embodiment, on-control signal generator 22 comprises a PWM signal generator and generates a PWM signal, wherein the PWM signal is generated according to at least one feedback signal indicating an output voltage or an output current.

Short protection circuit 23 is configured to provide a short protection signal SP for turning off power switch Q when a short condition occurs and the differential voltage Vd across power switch Q exceeds a safe limit. When short protection signal SP is in an effective state for example in logic LOW, power switch Q is turned off, and when short protection signal SP is in an ineffective state different from the effective state, for example in logic HIGH, power switch Q is turned on or off according to on-control signal ON. Short protection circuit 23 has a first input 231, a second input 232, a third input 233, a fourth input 234, a fifth input 235 and an output 236. The first input 231 is coupled to the first end P1 of power switch Q. The second input 232 is coupled to the second end P2 of power switch Q. Accordingly short protection circuit 23 can detect the differential voltage Vd across power switch Q by subtracting a second voltage V2 at the second input 232 of circuit 23 from a first voltage V1 at the first input 231 of circuit 23, that is Vd=V1−V2, where Vd represents the differential voltage across power switch Q. The third input 233 of short protection circuit 23 receives gate control signal GATE, the fourth input 234 of short protection circuit 23 receives on-control signal ON, the fifth input 235 of short protection circuit 23 receives a Power On Reset (POR) signal, and output 236 of short protection circuit 23 provides short protection signal SP.

Short protection circuit 23 comprises an enable circuit 31, a comparator 32 and a latch 33. Enable circuit 31 has a first input, a second input and an output, wherein the first input of enable circuit 31 is coupled to the control end of power switch Q to receive gate control signal GATE, the second input of enable circuit 31 receives on-control signal ON, and the output of enable circuit 31 provides an enable signal EN. When enable circuit 34 detects that gate control signal GATE is in effective state, enable signal EN transits into effective state to enable short protection circuit 23. In one embodiment, enable signal EN transits into effective state with a blanking time after gate control signal GATE transits in effective state. When enable circuit 31 detects that on-control signal ON is in ineffective state or gate control signal GATE is in ineffective state, for example logic LOW, enable signal EN transits in ineffective state and disable short protection circuit 23. Wherein either the ineffective state of on-control signal ON or the ineffective state of gate control signal GATE is used to turn off power switch Q.

Figure 4:
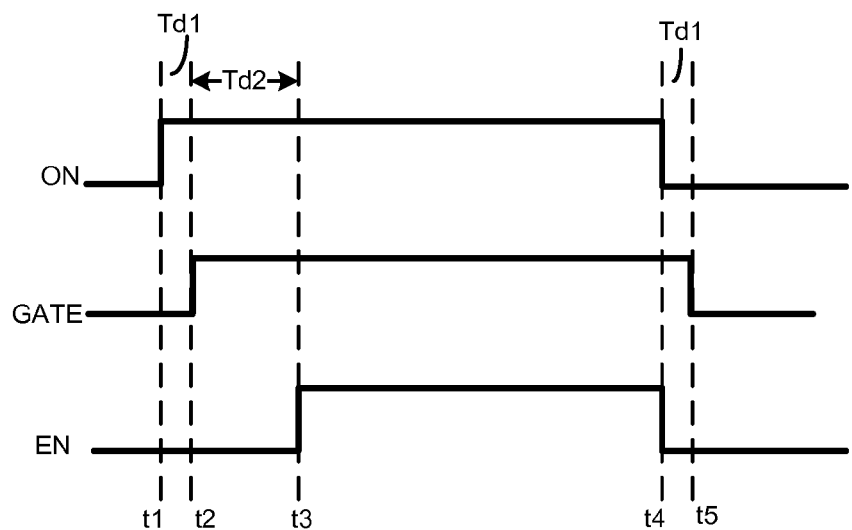
FIG. 4 shows a waveform diagram of some exemplary signals with reference to FIG. 3 to illustrate the function of an enable circuit, according to an embodiment of the present invention.

FIG. 4 shows a waveform diagram of some signals in power switch control circuit 300 of FIG. 3 to illustrate the function of enable circuit 31, according to an embodiment of the present invention. At time t1, on-control signal ON transits in effective state of logic HIGH. After a short circuit delay time Td1 and at time t2, gate control signal GATE transits in effective state of high voltage for turning on power switch Q. Circuit delay time Td1 may be generated by driver circuit 34. In the meantime, enable circuit 31 detects the effective change (leading edge) of gate control signal GATE. And after a blanking time Td2, at time t3, enable signal EN transits in effective state of logic HIGH. At time t4, on-control signal ON transits in logic LOW, and at the same time, enable signal EN is also triggered into logic LOW. From t3 to t4, short protection circuit 23 is enabled and comparator 32 monitors differential voltage Vd across power switch Q for monitoring short condition of power switch Q. A short circuit delay time Td1 after time t4, power switch Q is turned off. This function makes sure that short protection circuit 23 is only enabled when power switch is in the ON state.

Continuing with FIG. 3, comparator 32 has a first input 321, a second input 322, a third input 323 and an output 324, wherein the first input 321 of comparator 32 is coupled to the first end P1 of power switch Q, the second input 322 of comparator 32 is coupled to the second end of power switch Q, the third input 323 of comparator 32 is coupled to the output of enable circuit 31 and the output 324 of comparator 32 provides a comparing signal CMP. Comparator 32 comprises an enable switch K and a transistor T. As described above, enable switch K is turned on when enable signal EN is in effective state. Enable switch K has a first end coupled to the first input 231 of short protection circuit 23 and the first end P1 of power switch Q, a second end coupled to a control end of transistor T and a control end coupled to the output of enable circuit 31 to receive enable signal EN. Enable switch K is turned on when enable signal EN is in effective state, for example in logic HIGH. When enable switch K is turned on, comparator 32 detects voltage V1 at the first power node P1 through the first input 231 of short protection circuit 23 and detects voltage V2 at the second power node P2 through the second input 232 of short protection circuit 23. And accordingly differential voltage Vd across power switch Q is monitored by short protection circuit 23 with Vd=V1−V2.

Transistor T has a first end, a second end and a control end, wherein the first end of transistor T is coupled to the second input of comparator 32 to receive the second voltage V2, the second end of transistor T is coupled to an input of inverter X3, and the control end of transistor T is coupled to the second end of enable switch K.

When enable signal EN is in ineffective state, for example logic LOW, enable switch K is turned off and short protection circuit 23 is disabled. At this situation, comparing signal CMP is in ineffective state of logic LOW and short protection signal SP is in ineffective state of logic HIGH.

When enable signal EN is in effective state, short protection circuit 23 is enabled and enable switch K is turned on. At the same time, the first end P1 of power switch Q and the second end of power switch Q are coupled to a control end and one end of transistor T respectively. Accordingly, comparator 32 detects the differential voltage Vd across power switch Q, and compares differential voltage Vd to a threshold voltage of transistor T. Comparing signal CMP outputted by comparator 32 transits in effective state of logic HIGH when differential voltage Vd across power switch Q is higher than the threshold voltage of transistor T, and transits in ineffective state of logic LOW when differential voltage Vd across power switch Q is lower than the threshold voltage.

Latch 33 has a first input R, a second input S, and an output/Q, wherein the first input R receives the POR signal, the second input S is coupled to the output of comparator 32 to receive comparing signal CMP and the output/Q of latch 33 provides short protection signal SP. In the shown embodiment, the POR signal is supplied to a reset input R of latch 33 and comparing signal CMP is supplied to a set input S of latch 33. However, it should be known that the R input may receive comparing signal CMP and the S input may receive the POR signal when the logic gates of latch 33 changes. When power switch Q is reset, POR signal is in logic HIGH, and the output of latch 33 transits in logic HIGH which indicates that short protection signal SP is in ineffective state. The output of latch 33 maintains until when the output of comparator 32 transits in logic HIGH, latch 33 is set, and short protection signal SP transits into effective state of logic LOW. Latch 33 will be reset when POR signal is in effective state again.

However, it should be known that latch 33 may have other topologies that can turn off power switch Q when comparing signal CMP transits in effective state.

In the embodiment shown in FIG. 3, logic circuit 24 comprises a NAND gate. NAND gate 24 has a first input, a second input and an output, wherein the first input receives on-control signal ON, the second input of NAND gate 24 is coupled to output 236 of short protection circuit 23 to receive short protection signal SP, and the output of NAND gate 24 is coupled to driver circuit 34. Driver circuit 34 has an input and an output, wherein the input of driver circuit 34 is couple to the output of the logic circuit 24 and the output of the driver circuit 34 provides gate control signal GATE coupled to the control end of power switch Q. In another embodiment, logic circuit 24 comprises an AND gate, and when short protection signal SP transits in logic LOW (effective state of short protection signal SP), the output of logic circuit 23 transits in logic LOW to turn off power switch Q, while when short protection signal SP transits in logic HIGH (ineffective state of short protection signal SP), the logic level of the output of driver circuit 34 equals that of on-control signal ON, and accordingly power switch Q is turned on and off by on-control signal ON.

Figure 5:
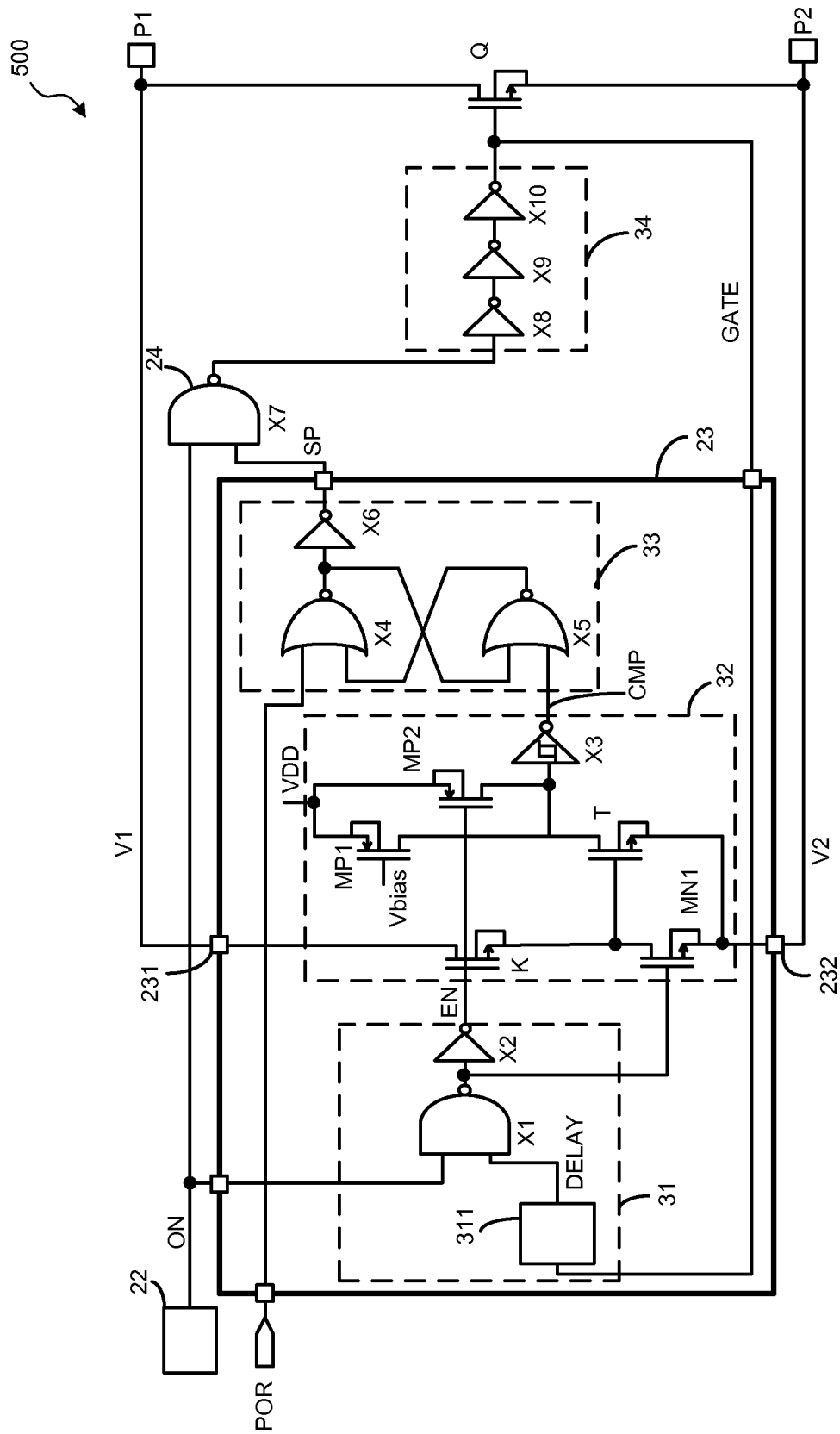
FIG. 5 illustrates a diagram of a detailed circuit of a power switch control circuit 500 according to an embodiment of the present invention.

FIG. 5 illustrates a diagram of a detailed circuit of a power switch control circuit 500 according to an embodiment of the present invention. Power switch control circuit 500 comprises a power switch Q, an on-control signal generator 22, a short protection circuit 23, a logic circuit 24 and a driver circuit 34. Short protection circuit 23 comprises an enable circuit 31, a comparator 32 and a latch 33.

Enable circuit 31 has a first input, a second input, a first output and a second output, wherein the first input of enable circuit 31 is configured to receive a gate control signal GATE, the second input of enable circuit 31 is configured to receive an on-control signal ON, the first output of enable circuit 31 is configured to provide an enable signal EN and the second output of enable circuit 31 provide a signal which is a NOT signal of enable signal EN. Enable circuit 31 comprises a delay circuit 311, a NAND gate X1 and an inverter X2. Delay circuit 311 has an input and an output, wherein the input of delay circuit 311 receives gate control signal GATE and the output of delay circuit 311 provides a delayed gate control signal DELAY. In one embodiment, delayed gate control signal DELAY follows gate control signal GATE with a delay of blanking time when gate control signal GATE transits into effective state, and has no delay when gate control signal GATE transits in ineffective state to turn off power switch Q. The blanking time ensures that the voltages at the first power node P1 and the second power node P2 are settled before short protection circuit 23 is enabled. NAND gate X1 has a first input, a second input and an output, wherein the first input is coupled to the output of delay circuit 311, and the second input of NAND gate X1 receives on-control signal ON. Inverter X2 has an input and an output, wherein the input of inverter X2 is coupled to the output of NAND gate X1, and the output of inverter X2 provides enable signal EN coupled to a control end of enable switch K. Thus, when both of on-control signal ON and the delayed gate control signal are in logic HIGH, the output of NAND gate X1 transits in logic LOW and enable signal EN at the output of inverter X2 transits in logic HIGH to turn on enable switch K, and short protection circuit 23 is enabled. In this configuration, enable signal EN transits into effective state of logic HIGH a blanking time after gate control signal GATE transits in high voltage, and enable signal EN transits into ineffective state of logic LOW when either on-control signal ON or delayed gate control signal DELAY transits into ineffective state of logic LOW.

Comparator 32 comprises enable switch K, transistor T, a second transistor MP1, a third transistor MN1, a fourth transistor MP2 and an inverter X3.

Enable switch K has a first end, a second end and a control end, wherein the first end of enable switch K is coupled to the first input 231 of short protection circuit 23, the second end of enable switch K is coupled to the control end of transistor T, and the control end of enable switch K is coupled to the first output of enable circuit 31 to receive enable signal EN. Enable switch K is turned on when enable signal EN is in effective state and couples the first power node P1 to the control end of transistor T, and in this way, short protection circuit 23 is enabled. In the shown embodiment, enable switch K is an NMOSFET and is turned on when enable signal EN is in logic HIGH. However, in other embodiments, enable switch can be in other forms such as a PMOSFET, and the control end of the PMOSFET is coupled to the second output of NAND gate X1 such that the enable switch is turned on when the delayed gate control signal DELAY is in effective state.

In the shown embodiment, transistor T comprises an N-channel Metal Oxide Semiconductor Field Effect Transistor (NMOSFET), and when enable switch K is turned on, the source of NMOSFET T receives voltage V2 and the gate of NMOSFET T receives voltage V1. However, it should be known that transistor T may be in other forms such as an NPN bipolar transistor. Transistor T may be a P-channel Metal Oxide Semiconductor Field Effect Transistor (PMOSFET) or a PNP bipolar transistor. In the shown embodiment, the threshold voltage of transistor T comprises an on-threshold of NMOSFET T. And when the differential voltage across power switch Q is higher than the on-threshold voltage of transistor T, transistor T is turned on and comparing signal CMP transits in effective state of logic HIGH, and when the differential voltage across power switch Q is lower than the on-threshold voltage of transistor T, transistor T is turned off and comparing signal CMP transits in ineffective state of logic LOW. In another embodiment, the threshold voltage may comprise an off-threshold voltage of a transistor, and wherein the differential voltage across the power switch is higher than the off-threshold voltage, the transistor is turned off and the comparing signal transits in effective state for turning off the power switch. Transistor T may be called the first transistor of comparator 32. The first transistor T has a first end, a second end and a control end, wherein the first end of the first transistor T is coupled to the second end of power switch Q to receive the second voltage V2, and the control end of the first transistor T is coupled to the second end of enable switch K. The second transistor MP1 has a first end, a second end a control end, wherein the first end of the second transistor MP1 is coupled to a reference voltage VDD, the second end of the second transistor MP1 is coupled to the second end of the first transistor T, and the control end of the second transistor MP1 is coupled to a bias voltage Vbias. The third transistor MN1 has a first end, a second end and a control end, wherein the first end of the third transistor MN1 is coupled to the second input 232 of short protection circuit to receive the second voltage V2, the second end of the third transistor MN1 is coupled to the second end of enable switch K and the control end of the third transistor MN1 is coupled to the second output of enable circuit 31. The fourth transistor MP2 has a first end, a second end and a control end, wherein the first end of the fourth transistor MP2 is coupled to the reference voltage VDD, the second end of the fourth transistor MP2 is coupled to the second end of the first transistor T, and the control end of the fourth transistor MP2 is coupled to the output of enable circuit 31 to receive enable signal EN. Inverter X3 has an input and an output, wherein the input of inverter X3 is coupled to the second end of the first transistor T, and the output of the inverter is configured to provide a comparing signal CMP supplied to latch 33. In the shown embodiment, the first transistor T comprises an NMOSFET, the second transistor MP1 comprises a PMOSFET, the third transistor MN1 comprises an NMOSFET and the fourth transistor MP2 comprises a PMOSFET. In one embodiment, inverter X3 comprises a hysteretic inverter.

In one embodiment, logic gates X1-X10 are biased with high voltage power inputs at reference voltage VDD, and with low voltage power inputs at the second voltage V2 of the second power node P2. Accordingly, the logic HIGH signal outputted by these gates X1-X10 has a voltage level approximating reference voltage VDD, and the logic LOW signal outputted by gates X1-X10 has a voltage level approximating voltage V2.

When enable signal EN is in logic HIGH, enable switch K is turned on and the gate of transistor T is coupled to the first power node P1 to receive a first voltage V1. Accordingly, the differential voltage Vd across power switch Q (Vd=V1−V2) is detected as the gate-source voltage Vgs of transistor T between the gate of transistor T and the source of transistor T. At the same time, NMOSFET MN1 and PMOSFET MP2 are turned off. At this time, if the differential voltage Vd across power switch Q exceeds an on threshold voltage Vth of transistor T, transistor T is turned on overcoming the bias current of PMOSFET MP1, and the voltage at the input of inverter X3 is in logic LOW. Thus comparing signal CMP at the output of inverter X3 is in effective state of logic HIGH to set latch 33, and short protection signal SP transits in effective state of logic LOW to turn off power switch Q.

However, if the differential voltage across power switch Q is lower than threshold voltage Vth, the first transistor T is in off state, and the bias current provided by PMOSFET MP1 keeps the voltage at the input of inverter X3 in logic HIGH. Thus comparing signal CMP at the output of inverter X3 is in ineffective state of logic LOW.

When enable signal EN transits in logic LOW, enable switch K is turned off to disable short protection circuit 23. At that time, NMOSFET MN1 and PMOSFET MP2 are turned on. Thus, the voltage at the input of inverter X3 equals the source voltage of PMOSFET MP2 which indicates a logic HIGH signal. Accordingly comparing signal CMP at the output of inverter X3 is in ineffective state of logic LOW.

Latch 33 comprises a first NOR gate X4, a second NOR X5, and an inverter X6. NOR gate X4 has a first input, a second input and an output, wherein the first input of NOR gate X4 receives a POR signal. NOR gate X5 has a first input, a second input and an output wherein the first input of NOR gate X5 is coupled to the output of NOR gate X4, the second input of NOR gate X5 is coupled to the output of comparator 32 to receive comparing signal CMP, and the output of NOR gate X5 is coupled to the second input of NOR gate X4. Inverter X6 has an input and an output, wherein the input of inverter X6 is coupled to the output of NOR gate X4, and the output of inverter X6 is configured to provide short protection signal SP. When POR signal transits in logic HIGH indicating effective state, latch 33 is reset, short protection signal SP transits in ineffective state of logic HIGH, and power switch Q is controlled by on-control signal ON. In one embodiment, POR signal is only in effective state for a short period and then transits into ineffective state. Latch 33 maintains in ineffective state of logic HIGH until when comparing signal CMP transits in effective state of logic HIGH. When comparing signal CMP transits in logic HIGH, latch 33 is set, short protection signal SP transits in effective state of logic LOW, and power switch Q is turned off. It should be known that the latch may have other topologies that can generate an effective short protection signal SP when comparing signal CMP is in effective state.

Logic circuit 24 comprises a NAND gate X7. NAND gate X7 has a first input, a second input and an output. Wherein the first input of NAND gate X7 receives on-control signal ON, the second input of NAND gate X7 receives short protection signal SP, and the output of NAND gate X7 is coupled to driver circuit 34.

Driver circuit 34 comprises three inverters X8, X9 and X10 coupled in series. Driver circuit 34 has an input coupled to the output of NAND gate X7, and an output providing gate control signal GATE coupled to the control end of power switch Q.

When short protection signal SP transits in effective state of logic LOW, the output of NAND gate X7 transits in logic HIGH, gate control signal GATE at the output of driver circuit 34 transits in ineffective state of low voltage, and power switch Q is turned off. When short protection signal SP transits in ineffective state of logic HIGH, the output of NAND gate is a NOT signal of on-control signal ON, the output of driver circuit 34 has a similar waveform shape with on-control signal ON, and accordingly power switch Q is turned on or off according to on-control signal ON.

It should be known that the logic circuit and the driver circuit may have other topologies to make sure that power switch Q is turned off when short protection signal SP is in effective state and is turned on and off according to on-control signal ON when short protection signal SP is in ineffective state.

Figure 6A:
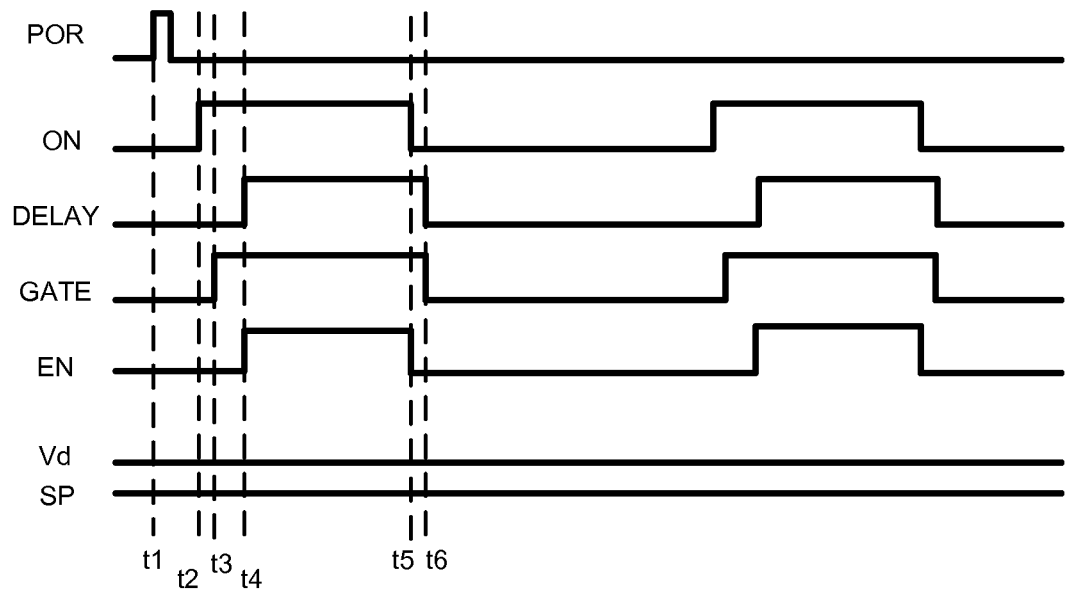
FIG. 6A-6C illustrate waveform diagrams of signals with reference to FIG. 5 in three different conditions according to an embodiment of the present invention.
Figure 6B:
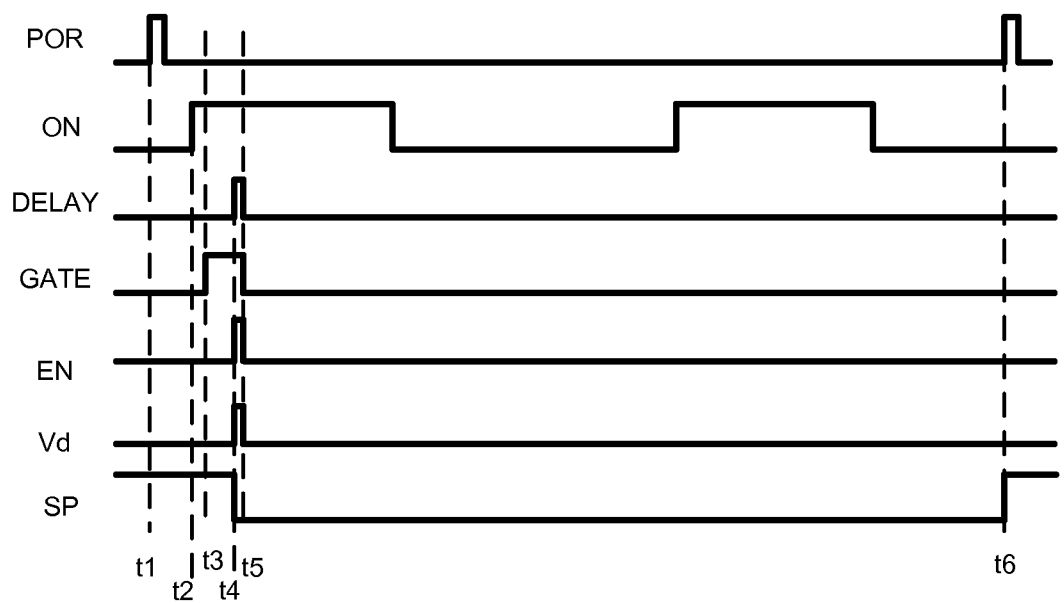
Figure 6C:
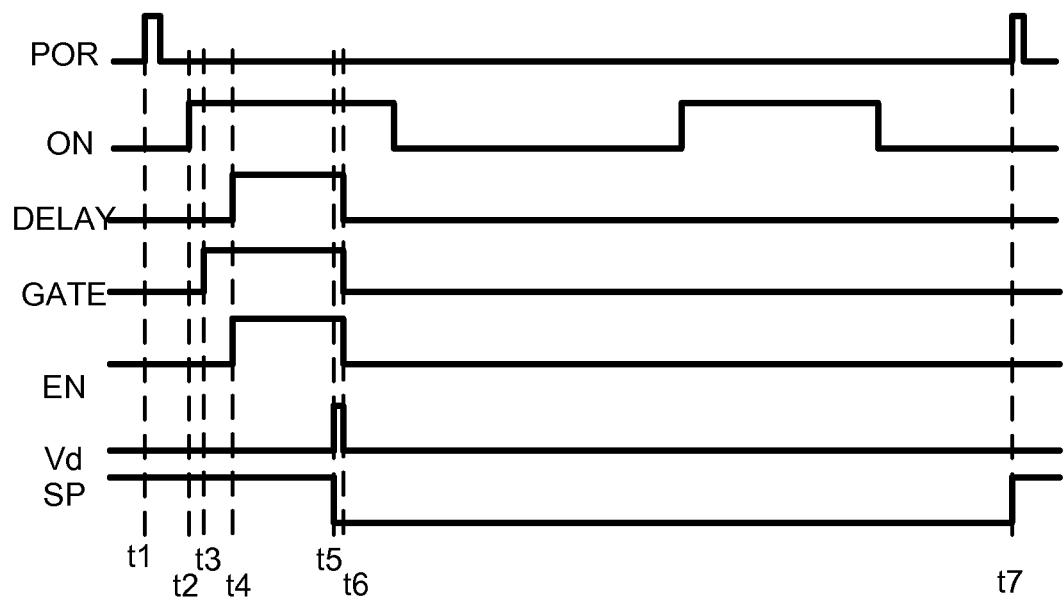

FIG. 6A-6C illustrate waveform diagrams of signals with reference to FIG. 5 in three different conditions according to an embodiment of the present invention. FIG. 6A illustrates signals in normal condition where no short condition occurs. FIG. 6B illustrates signals when the power switch is shorted before it is turned on. And FIG. 6C illustrates signals when the power switch is shorted while it is in the ON state.

First referring to FIG. 6A in normal condition where no short condition happens. The differential voltage Vd monitored at the comparator of the short protection circuit remains in low voltage when enable signal EN is in effective state of logic HIGH, and the short protection signal SP remain in ineffective state of logic HIGH. Gate control signal GATE is controlled according to on-control signal ON with a short circuit delay. At time t3, gate control signal GATE transits into effective state of high level. A blanking time later at time t4, delay signal DELAY transits into effective state of logic HIGH and at the same time, enable signal EN transits into effective state of logic HIGH. At time t5, on-control signal ON transits into ineffective state of logic LOW, and enable signal EN transits into ineffective state of logic LOW at the same time. It is noted that the same labels of t1-t7 in different drawings (FIG. 4, FIG. 6A, FIG. 6B, and FIG. 6C) denotes irrelevant time points, but only for illustrating the time sequences in each drawing.

Then referring to FIG. 6B in a condition that the power switch is shorted before it is turned on. At time t2, on-control signal ON transits into effective state of logic HIGH. A short circuit delay later at time t3, gate control signal GATE transits into effective state of high voltage. A blanking time later, at time t4, delay signal DELAY transits into effective state of logic HIGH, and enable signal EN transits into effective state of logic HIGH for enabling the short protection circuit. At the same time, the differential voltage Vd across the power switch is detected by the short protection circuit. At this time, since the power switch is in short condition, the detected differential voltage Vd is at high level which is higher than a threshold of the transistor, and short protection signal SP is triggered into effective state of logic LOW. A circuit delay time later and at time t5, gate control signal GATE transits into ineffective state of low level to turn off the power switch. At the same time, delayed gate control signal DELAY and the enable signal EN transits into ineffective state according to the falling edge of gate control signal GATE. Short protection signal SP remains in effective state of logic LOW for continuously keeping the power switch in OFF state until at time t6, POR signal transits into effective state of logic HIGH, short protection signal SP is triggered into ineffective state of logic HIGH.

And then referring to FIG. 6C in a condition where the power switch is shorted while it is in the ON state. Before time t5, the power switch works under normal condition. For example, at time t2, on-control signal ON transits into effective state of logic HIGH, and a short circuit delay later, at time t3, gate control signal GATE transits into high level to turn on the power switch. A blanking time later, at time t4, delayed gate control signal DELAY transits into effective state of logic HIGH and at the same time, enable signal EN transits into effective state and the short protection circuit is enabled for monitoring the differential voltage across the power switch and comparing the differential voltage to a threshold voltage of the transistor. During the normal condition, the differential voltage Vd is in low voltage which is lower than the threshold voltage of the transistor and short protection signal SP is in ineffective state of logic HIGH. At time t5, short condition occurs and the differential voltage Vd rises to a high voltage which is higher than the threshold voltage of the transistor. At the same time, short protection signal SP transits into effective state of logic LOW. A short circuit delay later, at time t6, gate control signal GATE transits in low level, and the power switch is turned off. At the same time, delayed gate control signal DELAY and enable signal EN transits in ineffective state of logic LOW to disable the short protection circuit. Since the comparator according to embodiments of the present invention has low accuracy requirement, it almost has no delay between short condition occurrence and short protection signal transiting into effective state, and thus the time delay between short condition occurrence and turning off the power switch is mainly decided by the circuit delay of the driver circuit which is very short. Short protection signal SP remains in logic LOW until at time t7, POR signal transits into effective state for resetting the power switch. And at the same time, short protection signal SP is triggered into ineffective state of logic HIGH, and the normal operation resumes.

Figure 7:
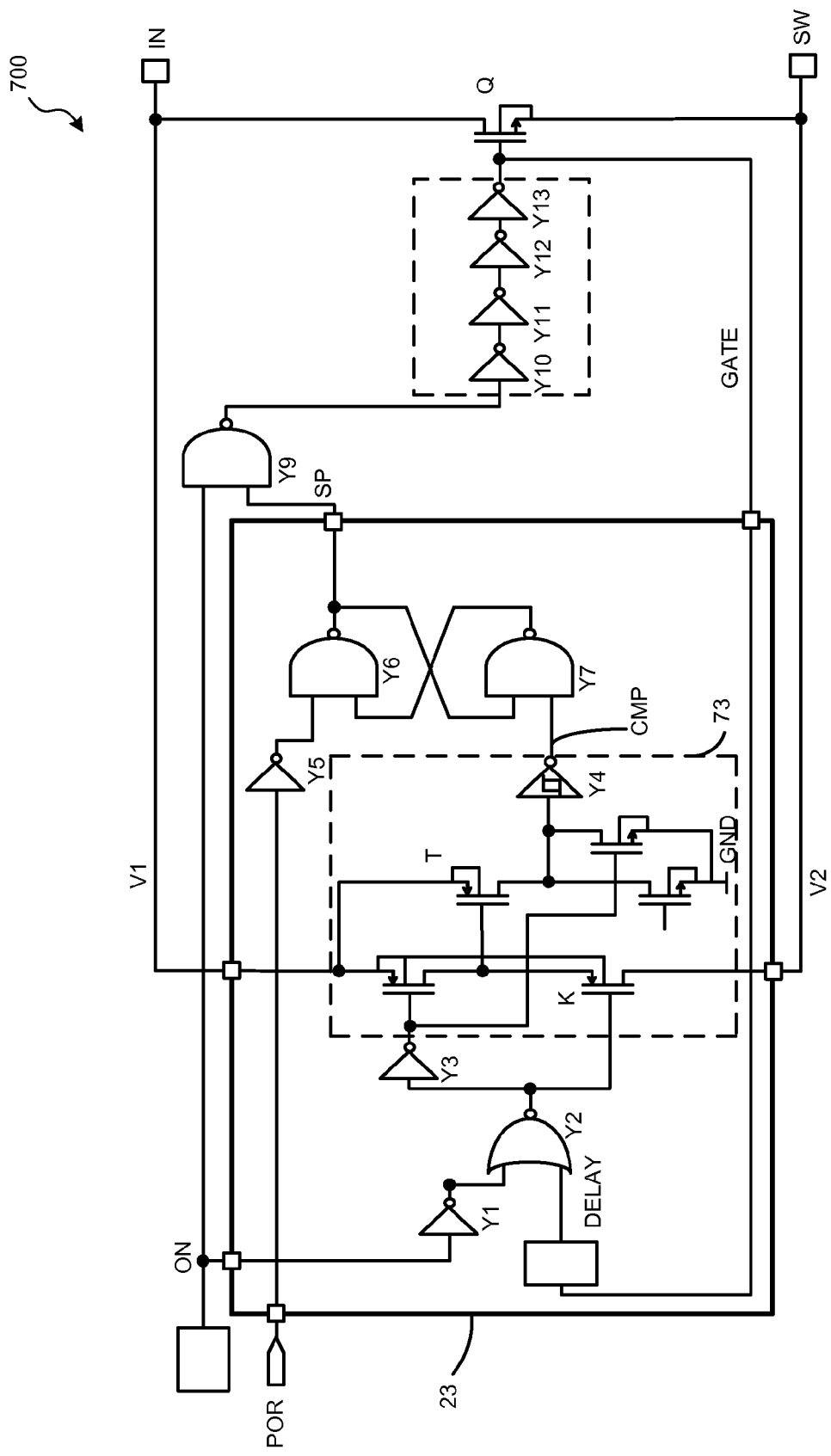
FIG. 7 illustrates a power switch control circuit 700 comprising a P-type power switch Q according to an embodiment of the present invention.

FIG. 7 illustrates a power switch control circuit 700 comprising a P-type power switch Q according to an embodiment of the present invention. The P-type power switch Q is turned on with a low voltage and turned off with a high voltage. Accordingly, the logic gates Y1-Y13 and transistors of comparator 73 in power switch control circuit 700 have a different configuration from those in FIG. 5 according to the different logic arithmetic to make sure that power switch Q is turned off only when power switch Q is in the ON state and the differential voltage across power switch Q is higher than a threshold of transistor T.

FIG. 8 illustrates a buck converter 800 according to an embodiment of the present invention. Buck converter 800 comprises a high-side power switch Q1 coupled between an input port IN and a switching node SW, a low-side power switch Q2 coupled between the switching node SW and a reference ground, an inductor L coupled between the switching node SW and an output port OUT, and an output capacitor Gout coupled between the output port OUT and the reference ground GND, wherein the output port OUT provides an output voltage Vout for supplying a load. Each of the power switches Q1 and Q2 has a short protection circuit, namely short protection circuit 831 and short protection circuits 832 respectively. Short protection circuit 831 is enabled when power switch Q1 is in an ON state, detects and compares the differential voltage across power switch Q1 to an on-threshold of transistor T1. Short protection circuit 832 is enabled when power switch Q2 is in the ON state, detects and compares the differential voltage across power switch Q2 to an on-threshold voltage of transistor T2. Short protection circuits 831 and 832 have the same configuration with that in FIG. 5 except that the gates in short protection circuit 831 is biased between switching node SW and a boot-strap voltage VBST which is higher than the voltage at switching node SW, while the gates in short protection circuit 832 is biased between the ground GND and a reference voltage VDRV, wherein voltage VDRV is higher than the ground voltage.

FIG. 9 illustrates a hot-swap circuit 900 comprising a short protection circuit 23 for protecting a load switch Q, according to an embodiment of the present invention. hot-swap circuit 900 comprises short protection circuit 23, an on-control signal generator 92 and a logic circuit 24. In one embodiment, short protection circuit 23 is enabled only when power switch Q is fully on where the voltage at the control end of power switch Q has driven to a maximum voltage. For example, during an inrush control period, power switch Q is in an ON state to charge a load capacitor. However, at this period, power switch Q is not fully on and short circuit protection 23 is disabled. When short protection circuit 23 is enabled and the differential voltage across power switch Q exceeds a threshold voltage of a transistor in short protection circuit 23, power switch Q is turned off.

FIG. 10 illustrates an electrical fuse circuit 1000 comprising a short protection circuit 23 for protection an electrical fuse power switch Q according to an embodiment of the present invention. In one embodiment, short protection circuit 23 is enabled only when power switch Q is fully on where the voltage at the control end of power switch Q has driven to a maximum voltage. When short protection circuit 23 is enabled and the differential voltage across power switch Q exceeds a threshold voltage of a transistor in short protection circuit 23, power switch Q is turned off.

Figure 11:
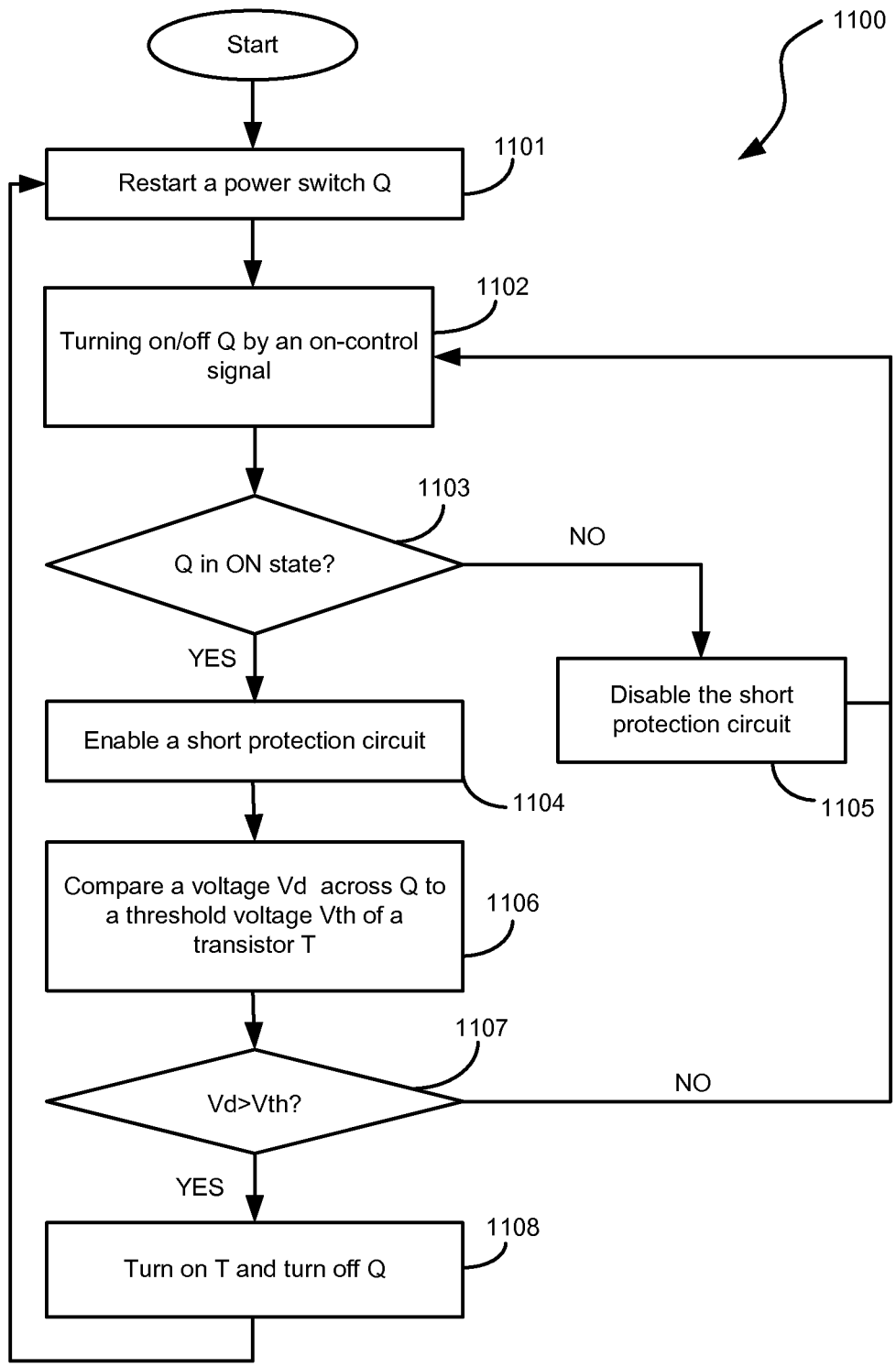
FIG. 11 illustrates a flow chart of a short protection method 1100 for a power switch according to an embodiment of the present invention.

FIG. 11 illustrates a flow chart of a short protection method 1100 for protecting a power switch from electrical short damage, according to an embodiment of the present invention. Method 1100 comprises detecting the ON state of the power switch, comparing a differential voltage of the power switch to a threshold voltage of a transistor when the power switch is in the ON state, and turning off the power switch when the differential voltage is higher than the threshold voltage.

In detail, method 1100 comprises in step 1101 restarting a power switch Q. In one embodiment, restarting power switch Q comprises providing a POR signal, and then the system starts working. In one embodiment, power switch Q is used in a SMPS.

Method 1100 comprises in step 1102 turning on or off power switch Q by an on-control signal. In one embodiment, an effective state of the on-control signal is configured to turn on power switch Q and an ineffective state of the on-control signal is configured to turn off power switch Q.

Then turn to step 1103 of method 1100. In step 1103, detecting whether power switch Q is in an ON state. If power switch Q is in the ON state, then turn to step 1104, and if power switch Q is detected in off state, then turn to step 1105. In one embodiment, detecting whether the power switch is in the ON state is from judging a gate control signal supplied to a control end of the power switch.

In step 1104, method 1100 comprises enabling a short protection circuit. In one embodiment, enabling the short protection circuit comprises turning on an enable switch for detecting the differential voltage across the power switch. In one embodiment, a short blanking time is added between turning on the power switch and turning on the enable switch, thus the short protection circuit is enabled a blanking time after the power switch is turned on to make sure that the voltages at two ends of the power switch are settled. Otherwise if power switch Q is or tends to be turned off, the short protection circuit is disabled and the enable switch is turned off in step 1105.

Method 1100 further comprises in step 1106 comparing a differential voltage Vd across power switch Q to a threshold voltage Vth of a transistor T. In one embodiment, step 1106 comprises coupling two ends of the power switch to a control end and an input end of the transistor. And in one embodiment, the two ends of the power switch are coupled to the gate and the source of an NMOSFET respectively, and thus the gate-source voltage Vgs of the NMOSFET equals the differential voltage across the power switch, wherein the threshold voltage comprises an on-threshold of the NMOSFET.

Method 1100 further comprises in step 1107 judging whether differential voltage Vd is higher than threshold voltage Vth of transistor T. If voltage Vd is higher than threshold voltage Vth, then turns to step 1108. Or otherwise, if voltage Vd is lower than threshold voltage Vth, then turns to step 1102, and the power switch Q is turned on and off according to the on-control signal.

In step 1108, method 1100 comprises turning on transistor T and turning off power switch Q. In one embodiment, the power switch is turned off by triggering a short protection signal outputted by the short protection circuit into effective state. In one embodiment, the transistor comprises an NMOSFET, and since the gate-source voltage Vgs of the NMOSFET equals the differential voltage across the power switch, when the differential voltage is higher than the on-threshold voltage, the NMOSFET is turned on accordingly. And this triggers the short protection signal into effective state and turning off the power switch. Power switch Q would maintain in off state until power switch Q is restarted again, which turns to step 1101 again.

It should be known that the effective state or the ineffective state of a signal may be either in logic HIGH or in logic LOW, and a logic circuit may have various configurations within the sprit and the scope of the invention as defined in the appended claims.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

I claim:

1. A short protection circuit for protecting a power switch, the power switch having a first end, a second end and a control end, the short protection circuit having a first input, a second input and an output, wherein the first input of the short protection circuit is coupled to the first end of the power switch, the second input of the short protection circuit is coupled to the second end of the power switch, and the output of the short protection circuit is configured to provide a short protection signal, the short protection circuit comprising a transistor, and wherein:

the transistor has a threshold voltage;

the short protection circuit is configured to compare a differential voltage between the first end of the power switch and the second end of the power switch to the threshold voltage of the transistor only when the power switch is in an ON state; wherein when the differential voltage is higher than the threshold voltage, the short protection signal transits in an effective state configured to turn off the power switch;

further comprising an enable circuit having a first input, a second input and an output, wherein the first input of the enable circuit is coupled to the control end of the power switch configured to receive a gate control signal, the second input of the enable circuit is configured to receive an on-control signal and the output of the enable circuit is configured to provide an enable signal, wherein the enable signal transits into an effective state with a blanking time after the gate control signal transits into an effective state and the enable signal transits into an ineffective state different from the effective state of the enable signal when either the on-control signal transits into an ineffective state or the gate control signal transits into an ineffective state, further wherein the effective state of the gate control signal is configured to turn on the power switch, and each of the ineffective state of the on-control signal and the ineffective state of the gate control signal are configured to turn off the power switch;

a comparator comprising an enable switch and the transistor, the comparator having a first input, a second input, a third input and an output, wherein the first input of the comparator is coupled to the first end of the power switch, the second input of the comparator is coupled to the second end of the power switch, the third input of the comparator is coupled to the output of the enable circuit configured to receive the enable signal, and the output of the comparator is configured to provide a comparing signal, and wherein when the enable signal is in the effective state of the enable signal, the enable switch is turned on and the comparator is configured to compare the differential voltage of the power switch to the threshold voltage of the transistor, and wherein when the differential voltage is higher than the threshold voltage, the comparing signal is in an effective state, and when the differential voltage is lower than the threshold voltage, the comparing signal is in an ineffective state, and further wherein when the enable signal is in the ineffective state of the enable signal, the enable switch is turned off, and the comparing signal is in the ineffective state of the comparing signal; and a latch having a first input, a second input and an output, wherein the first input of the latch is configured to receive a POR signal, the second input of the latch is coupled to the output of the comparator configured to receive the comparing signal, and the output of the latch is configured to provide the short protection signal, and wherein when the comparing signal transits in the effective state of the comparing signal, the short protection signal transits in the effective state of the short protection signal, and wherein when the POR signal transits in an effective state, the short protection signal transits in an ineffective state different from the effective state of the short protection signal.

2. The short protection circuit of claim 1, further having a third input, a fourth input and a fifth input, wherein the third input of the short protection circuit is coupled to the control end of the power switch, the fourth input of the short protection circuit is configured to receive an on-control signal, and the fifth input of the short protection circuit is configured to receive a power on reset (POR) signal.

3. The short protection circuit of claim 1, wherein the enable circuit comprises:

a delay circuit having an input and an output, wherein the input of the delay circuit is configured to receive the gate control signal;

a NAND gate having a first input, a second input and an output, wherein the first input of the NAND gate is coupled to the output of the delay circuit, and the second input of the NAND gate is configured to receive the on-control signal; and an inverter having an input and an output, wherein the input of the inverter is coupled to the output of the NAND gate, and the output of the inverter is configured to provide the enable signal.

4. The short protection circuit of claim 1, wherein:

the enable switch has a first end, a second end and a control end, wherein the first end of the enable switch is coupled to the first input of the comparator, and the control end of the enable switch is coupled to the output of the enable circuit;

the transistor comprise a first transistor of the comparator, the first transistor having a first end, a second end and a control end, wherein the first end of the first transistor is coupled to the second input of the comparator, and the control end of the transistor is coupled to the second end of the enable switch;

and the comparator further comprising:

a second transistor having a first end, a second end a control end, wherein the first end of the second transistor is coupled to a reference voltage, the second end of the second transistor is coupled to the second end of the first transistor, and the control end of the second transistor is coupled to a bias voltage;

a third transistor having a first end, a second end and a control end, wherein the first end of the third transistor is coupled to the second end of the power switch, the second end of the third transistor is coupled to the second end of the enable switch and the control end of the third transistor is coupled to a second output of the enable circuit;

a fourth transistor having a first end, a second end and a control end, wherein the first end of the fourth transistor is coupled to the reference voltage, the second end of the fourth transistor is coupled to the second end of the first transistor, and the control end of the fourth transistor is coupled to the output of the enable circuit; and an inverter having an input and an output, wherein the input of the inverter is coupled to the second end of the first transistor, and the output of the inverter is configured to provide the comparing signal.

5. The short protection circuit of claim 4, wherein the first transistor comprises an NMOSFET, the second transistor comprises a PMOSFET, the third transistor comprises an NMOSFET and the fourth transistor comprises a PMOSFET.

6. The short protection circuit of claim 1, wherein the power switch comprises a low-side switch of a boost converter, and wherein the first end of the power switch is coupled to a switching node of the boost converter, and the second end of the power switch is coupled to a reference ground.

7. The short protection circuit of claim 1, wherein the power switch comprises a high-side switch of a buck converter, and wherein the first end of the power switch is coupled to an input port of the buck converter, and the second end of the power switch is coupled to a switching node of the buck converter.

8. The short protection circuit of claim 1, wherein the power switch comprises a low-side switch of a buck converter, and wherein the first end of the power switch is coupled to a switching node of the buck converter, and the second end of the power switch is coupled to a reference ground.

9. The short protection circuit of claim 1, wherein the power switch comprises a load switch of a hot-swap circuit.

10. The short protection circuit of claim 1, wherein the power switch comprises an electrical fuse power switch of an electrical fuse circuit.

11. The short protection circuit of claim 1, further comprising a logic circuit, the logic circuit having a first input, a second input and an output, wherein the first input of the logic circuit is configured to receive an on-control signal, the second input of the logic circuit is configured to receive the short protection signal, and the output of the logic circuit is coupled to the control end of the power switch.

12. The short protection circuit of claim 11, wherein the logic circuit comprises an AND gate.

13. A switching mode power supply (SMPS), comprising:
a switching circuit for converting an input voltage at an input port into an output voltage at an output port, wherein the switching circuit comprises a power switch and is configured to regulate the output voltage via controlling the ON and OFF actions of the power switch, and wherein the power switch has a first end, a second end and a control end;
an on-control signal generator having an output configured to provide an on-control signal for selectively turning on the power switch;
a short protection circuit configured to provide a short protection signal, the short protection circuit comprising a transistor, wherein the short protection circuit is configured to compare a differential voltage between the first end of the power switch and the second end of the power switch to a threshold voltage of the transistor to obtain a comparing signal only when the power switch is in an ON state, and wherein the short protection signal is generated according to the comparing signal,
wherein the short protection circuit comprises:
an enable circuit having a first input, a second input and an output, wherein the first input of the enable circuit is coupled to the control end of the power switch configured to receive a gate control signal, the second input of the enable circuit is configured to receive the on-control signal and the output of the enable circuit is configured to provide an enable signal, and wherein the enable signal transits into an effective state with a blanking time after the gate control signal transits into an effective state, and the enable signal transits into an ineffective state when the on-control signal transits into an ineffective state or the gate control signal transits into an ineffective state, and further wherein the effective state of the gate control signal is configured to turn on the power switch, each of the ineffective state of the on-control signal and the ineffective state of the gate control signal are configured to turn off the power switch;
a comparator comprising an enable switch and the transistor, the comparator having a first input, a second input, a third input and an output, wherein the first input of the comparator is coupled to the first end of the power switch, the second input of the comparator is coupled to the second end of the power switch, the third input of the comparator is coupled to the output of the enable circuit configured to receive the enable signal, and the output of the comparator is configured to provide the comparing signal, and wherein when the enable signal is in the effective state of the enable signal, the enable switch is turned on and the comparator is configured to compare the differential voltage of the power switch to the threshold voltage of the transistor, and wherein when the differential voltage is higher than the threshold voltage, the comparing signal is in an effective state, and when the differential voltage is lower than the threshold voltage, the comparing signal is in an ineffective state, and further wherein when the enable signal is in the ineffective state of the enable signal, the enable switch is turned off, and the comparing signal is in the ineffective state of the comparing signal;
a latch having a first input, a second input and an output, wherein the first input of the latch is configured to receive a POR signal, the second input of the latch is coupled to the output of the comparator configured to receive the comparing signal, and the output of the latch is configured to provide the short protection signal; wherein:
when the comparing signal transits in the effective state of the comparing signal, the short protection signal transits in an effective state for turning off the power switch; and
when the POR signal transits in an effective state, the short protection signal transits in an ineffective state, and the on-control signal is configured to control the power switch; and
a logic circuit having a first input, a second input and an output, wherein the first input of the logic circuit is configured to receive the on-control signal, the second input of the logic circuit is configured to receive the short protection signal, and the output of the logic circuit is coupled to a control end of the power switch for turning on and off the power switch.

14. The SMPS of claim 13, wherein the switching circuit comprises a boost converter.

15. The SMPS of claim 13, wherein:
the enable switch has a first end, a second end and a control end, wherein the first end of the enable switch is coupled to the first input of the comparator, and the control end of the enable switch is coupled to the output of the enable circuit;
the transistor comprise a first transistor of the comparator, the first transistor having a first end, a second end and a control end, wherein the first end of the first transistor is coupled to the second input of the comparator, and the control end of the first transistor is coupled to the second end of the enable switch;
and the comparator further comprising:
a second transistor having a first end, a second end a control end, wherein the first end of the second transistor is coupled to a reference voltage, the second end of the second transistor is coupled to the second end of the first transistor, and the control end of the second transistor is coupled to a bias voltage;
a third transistor having a first end, a second end and a control end, wherein the first end of the third transistor is coupled to the second end of the power switch, the second end of the third transistor is coupled to the second end of the enable switch and the control end of the third transistor is coupled to a second output of the enable circuit;
a fourth transistor having a first end, a second end and a control end, wherein the first end of the fourth transistor is coupled to the reference voltage, the second end of the fourth transistor is coupled to the second end of the first transistor, and the control end of the fourth transistor is coupled to the output of the enable circuit; and an inverter having an input and an output, wherein the input of the inverter is coupled to the second end of the first transistor, and the output of the inverter is configured to provide the comparing signal.

16. A short protection method for a power switch, comprising:
  detecting a state of the power switch;
  comparing a differential voltage across the power switch to a threshold voltage of a transistor when the power switch is in an ON state, comprising coupling two ends of the power switch to a gate of an NMOSFET and a source of the NMOSFET respectively, and the threshold voltage comprises an on-threshold of the NMOSFET; and
  turning off the power switch when the differential voltage is higher than the threshold voltage;
  further comprising:
  restarting the power switch by a POR signal;
  turning on or off the power switch by an on-control signal;
  enabling a short protection circuit during the ON state of the power switch and disabling the short protection circuit when the power switch is to be turned off, wherein enabling the short protection circuit comprises turning on an enable switch for coupling two ends of the power switch to the transistor;
  when the short protection circuit is enabled and if the differential voltage is higher than the threshold voltage, turning on the transistor and turning off the power switch, and keeping the power switch in off state until the power switch is restarted again.

* * * * *